(12) United States Patent
Aigner et al.

(10) Patent No.: US 7,268,436 B2
(45) Date of Patent: Sep. 11, 2007

(54) ELECTRONIC DEVICE WITH CAVITY AND A METHOD FOR PRODUCING THE SAME

(75) Inventors: Robert Aigner, Unterhaching (DE); Albert Auburger, Regenstauf (DE); Frank Daeche, München (DE); Guenter Ehrler, Holzkirchen (DE); Andreas Meckes, München (DE); Horst Theuss, Wenzenbach (DE); Michael Weber, Mainburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 10/795,344

(22) Filed: Mar. 9, 2004

(65) Prior Publication Data

US 2004/0201090 A1    Oct. 14, 2004

(30) Foreign Application Priority Data

Mar. 10, 2003    (DE) ............................... 103 10 617

(51) Int. Cl.
*H01L 23/12* (2006.01)
*H01L 23/48* (2006.01)
*H01L 23/52* (2006.01)
*H01L 29/40* (2006.01)

(52) U.S. Cl. ............... 257/777; 257/686; 257/680; 257/704

(58) Field of Classification Search ............... 257/686, 257/680, 777
See application file for complete search history.

(56) References Cited

U.S. PATENT DOCUMENTS

| 5,283,468 | A  | * | 2/1994  | Kondo et al. ............... 257/774 |
| 5,323,051 | A  |   | 6/1994  | Adams et al. |
| 5,345,201 | A  |   | 9/1994  | Greer et al. |
| 5,900,581 | A  | * | 5/1999  | Ootake .................... 174/523 |
| 5,920,142 | A  |   | 7/1999  | Onishi et al. |
| 5,969,461 | A  |   | 10/1999 | Anderson et al. |
| 6,157,080 | A  | * | 12/2000 | Tamaki et al. ............. 257/738 |
| 6,252,778 | B1 | * | 6/2001  | Tonegawa et al. .......... 361/761 |
| 6,320,267 | B1 | * | 11/2001 | Yukawa ..................... 257/783 |
| 6,376,915 | B1 | * | 4/2002  | Hikita et al. ............... 257/777 |
| 6,448,635 | B1 | * | 9/2002  | Glenn ....................... 257/676 |
| 6,815,869 | B2 | * | 11/2004 | Baba et al. .............. 310/313 R |
| 7,034,434 | B2 | * | 4/2006  | Yamamoto et al. ...... 310/313 R |
| 7,141,782 | B2 | * | 11/2006 | Chen ....................... 250/239 |
| 2001/0020738 | A1 | * | 9/2001 | Iizima et al. .............. 257/680 |
| 2002/0079590 | A1 | * | 6/2002 | Nakaoka et al. ........... 257/777 |
| 2003/0038355 | A1 | * | 2/2003 | Derderian .................. 257/686 |

FOREIGN PATENT DOCUMENTS

| DE | 19620940 A1    | 5/1997 |
| EP | 0794616 A2     | 9/1997 |
| KR | 2002035206 A   | 5/2002 |
| WO | WO 03/070624 A2 | 8/2003 |

* cited by examiner

*Primary Examiner*—Sue A. Purvis
*Assistant Examiner*—Benjamin P. Sandvik
(74) *Attorney, Agent, or Firm*—Edell, Shapiro & Finnan, LLC

(57) ABSTRACT

An electronic device can include a top side with circuit structures. The circuit structures form the bottom region of a cavity. Each cavity can be surrounded by a cavity frame made of plastic and can have a cavity cover made of semiconductor material.

6 Claims, 3 Drawing Sheets

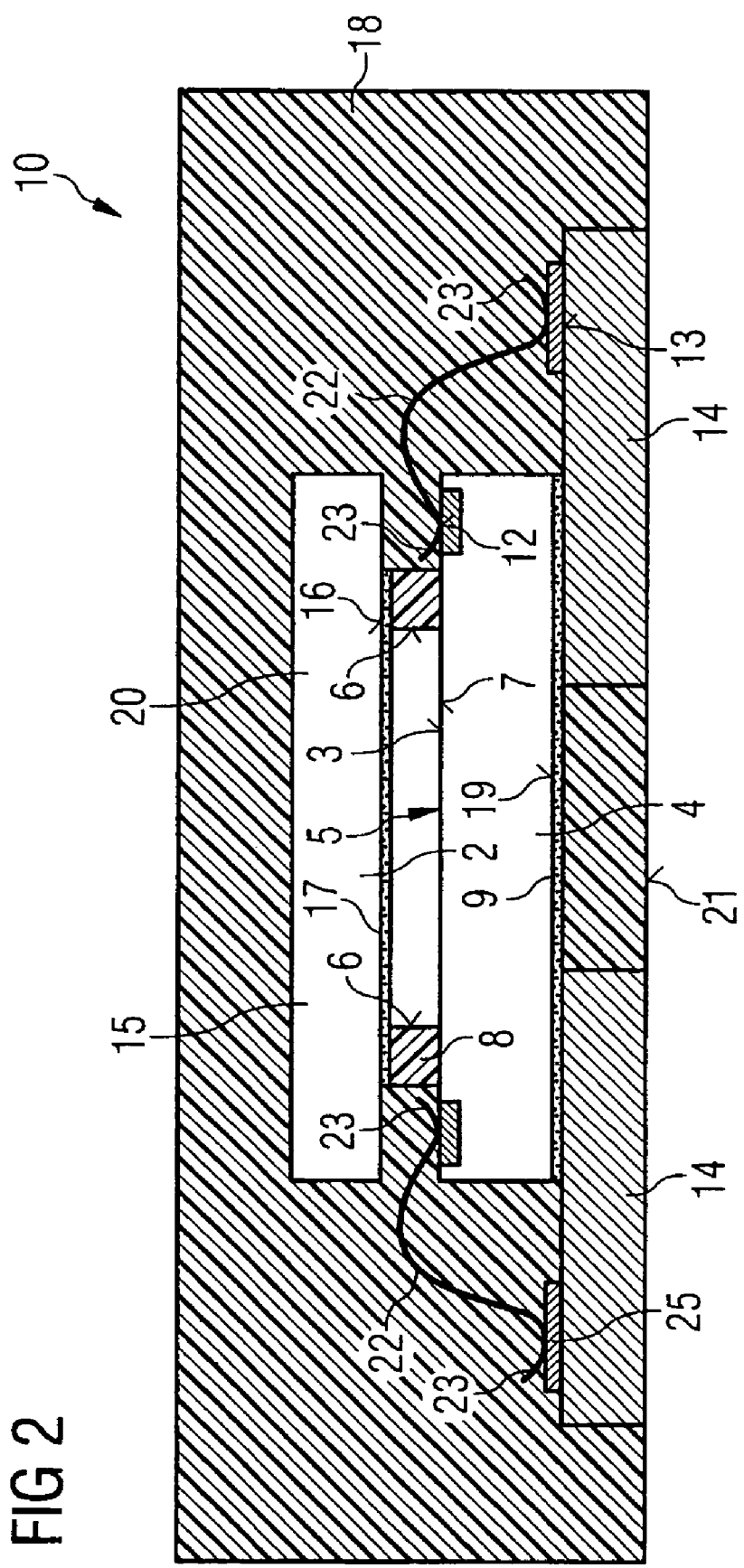

ELECTRONIC DEVICE WITH CAVITY AND A METHOD FOR PRODUCING THE SAME

CROSS REFERENCE TO RELATED APPLICATIONS

This application claims priority under 35 USC §119 to German Application No. 10310617.0, filed on Mar. 10, 2003, and titled "Electronic Device With Cavity And A Method For Producing The Same," the entire contents of which are hereby incorporated by reference.

FIELD OF THE INVENTION

The invention relates to an electronic device with a semiconductor chip which has a top side with circuit structures and is arranged in a cavity and to a method for producing the device.

BACKGROUND

Electronic devices are equipped with a cavity for receiving semiconductor chips with circuit structures, such as for receiving surface acoustic wave filters, also called SAW, or for receiving bulk acoustic wave filters, also called BAW. In order to ensure a cavity on a semiconductor chip above such surface regions with circuit structures, the entire semiconductor chip is incorporated into complicated ceramic housings or a complicated and cost-intensive technique is used to mold plastic housing frames on flat leadframes, into which the semiconductor chips are then incorporated in their entire size. Such structures of cavities with semiconductor chips not only have a complex and cost-intensive construction but are also relatively voluminous and not accessible to miniaturization.

SUMMARY

A cost-effective electronic device with cavity which can be substantially reduced in its spatial dimensions without impairing the electrical properties, in particular, the filter properties is desirable, and a method for producing the same.

The invention includes an electronic device having a semiconductor chip which has a top side with circuit structures, which in each case form the bottom region of a cavity. Each cavity can be surrounded by a cavity frame made of plastic. The cavity frame can lay on the top side of the semiconductor chip. A cavity cover made of semiconductor material can be arranged on the cavity frame. Since the cavity frame on the semiconductor chip surrounds the region of the circuit structure, an electronic device can be reduced in size compared with conventional devices, especially since the semiconductor chip does not have to be incorporated into a cavity housing. Rather, a cavity can be present on the semiconductor chip and in the region or regions in which corresponding circuit structures which require such a cavity are arranged.

Furthermore, the cavity cover made of a semiconductor material can have a positive effect on the electrical properties of the surface structures, especially since the relative permittivity of the cavity cover made of semiconductor material is low. In this electronic device, the semiconductor chips laying one on the other in a sandwich-like manner close together so that the headroom of the cavities can be less than 200 μm.

The cavity frame may be formed by patterning a photoresist layer. The contact areas on the top side of the semiconductor chip can be kept free of the plastic of the cavity frames. The circuit structures on the semiconductor chip can be driven via bonding connections between the contact areas on the top side of the semiconductor chip and inner areas of external contacts. Adhesive films can be applied on the rear sides of the semiconductor chip with circuit structures and the semiconductor chip used as cavity cover. The first adhesive film on the semiconductor chip with circuit structures can attach the semiconductor chip on the inner areas of external contacts. The first adhesive film can provide for a secure positioning of the semiconductor chip with circuit structures during the production of bonding connections between contact areas on the top side of the semiconductor chip and inner areas of external contacts.

The second adhesive film on the rear side of the semiconductor chip which serves as cavity cover, can compensate for the unevennesses of the plastic layer forming the cavity frames. Moreover, the adhesive film can ensure relatively complete sealing with respect to the subsequent application of the plastics housing composition for embedding the semiconductor chips so that no plastic composition can fill the cavities.

The external contacts can be arranged on the underside of the electronic device and may populate the entire underside of the electronic device. Since the area of the semiconductor chip increases, an increasing number of external contacts can be arranged on the underside.

A further miniaturization of the electronic device becomes possible because the bonding connection between bonding wire and contact area of the semiconductor chip and the bonding connection between bonding wire and inner area of the external contact each can have a bonding arc. Such bonding arcs can be made flatter than arcs made possible by thermocompression heads. In the case of thermocompression heads, the bonding wire, after bonding connection, can initially be drawn up perpendicularly to the contact area before a bonding wire arc can be attached. Since this drawn-up bonding wire arc can be arranged between the semiconductor chip serving as cavity cover and the active semiconductor chip, a relatively large distance can remain between the two semiconductor chips and hence a relatively high cavity can remain. The height of this cavity can be reduced by the use of flat bonding arcs on both the semiconductor chip and the inner area of the external contact and by dispensing with thermocompression heads.

In a further embodiment of the invention, a plurality of semiconductor chips to form a semiconductor chip module can be embedded in a plastics housing composition. In this case, the semiconductor chip module can have a plurality of cavities closed off by a common cavity cover. For a larger number of circuit structures, respective individual semiconductor chips can be provided with cavity frames. For the cavity cover, by contrast, a large-area semiconductor chip can be provided, which can reduce the manufacturing costs.

A method for producing electronic devices having at least one cavity above a surface region of a semiconductor chip can include providing a semiconductor wafer with semiconductor chip positions which have circuit structures to be provided with cavities in predetermined surface regions and applying a patterned plastic layer to this semiconductor wafer with the circuit structures to be provided with cavities being left free and with the formation of cavity frames. The layer can be, for example, a few micrometers thick and may have a thickness of up to 200 μm.

Before the semiconductor wafer can be separated into first semiconductor chips by sawing, an adhesive film can be applied to the rear side of the semiconductor chip. This adhesive film can ensure that the semiconductor wafer does not shift in the course of separation into the first semiconductor chips with adhering adhesive film. After the semiconductor wafer has been separated into first semiconductor chips with adhering adhesive film, the semiconductor chips can be applied to a metal frame for flat-conductor-free housings with adhesive bonding of the semiconductor chip and curing of the adhesive film on the rear side of the semiconductor chip.

Here, too, the adhesive film can serve to fix the semiconductor chip, i.e., on inner areas of external contacts. This fixing can support a secure bonding of the contact areas on the top side of the semiconductor chip with contact pads on the inner areas of the external contacts. The contact pads may have a bondable refinement layer with respect to the metals of the external contacts. Such refinement layers can have gold or alloys of gold. They can support the production of bonding connections between contact areas on the top side of the semiconductor chip and inner areas of external contacts of the metal frame.

Afterwards, the cavity frame can be covered with the second semiconductor chip. For this purpose, the second semiconductor chip can have an adhesive film on its rear side, which adhesive film corresponds to the adhesive film of the first semiconductor chip. This adhesive film on the rear side of the second semiconductor chip can provide for compensation of unevennesses of the cavity frame around each circuit structure. After the fitting of the second semiconductor chip as cavity cover, the semiconductor chips can be packaged with the bonding wires in a plastics housing composition. In this case, the bonding wires, the semiconductor chips, and the cavity frame can be embedded in the plastics composition, and the external contacts at the underside of the electronic device can remain freely accessible.

After the semiconductor chips have been packaged in the housing plastics composition, the metal frame which has received a plurality of electronic devices can be separated into individual electronic devices. Both the cavity frame and the first and second adhesive films can be prepared simultaneously for a plurality of electronic devices at the wafer level in a relatively inexpensive manner. Consequently, it is possible to use a plurality of tried and tested steps known from semiconductor technology.

In particular, a photoresist layer can be applied to the top side of the semiconductor wafer, and can subsequently be patterned photolithographically to form cavity frames. During this photopatterning, the circuit structures and the contact areas on the semiconductor chip can be kept free of photoresist. A photoresist with the customary commercial abbreviation SU8 can be used. The latter can be patterned relatively finely in order to produce a plurality of cavities, subdivided by small webs, at predetermined locations of the semiconductor chip. Consequently, a relatively small, miniaturized foot-print can be produced. In the case of larger structures, printing techniques can be used to realize the cavity frames. In this connection, screen printing techniques can be used to produce the cavity frames per se in the form of webs, while the circuit structures can remain completely free of plastic. Both the first and second adhesive film on the rear sides of the semiconductor chips can include UV-precurable material and can be subject to UV irradiation prior to separation by a diamond saw in order to achieve a fixing in the separating installation on account of the precuring by ultraviolet light. Over and above pure precuring using UV light, the first and second adhesive films may be thermally curable. A corresponding thermal curing step may be effected after the application of the semiconductor chip with first adhesive film on inner areas of external contacts of a metal frame and before the bonding of the bonding connections. This can ensure that the semiconductor chip cannot be shifted during bonding.

BRIEF DESCRIPTION OF THE DRAWINGS

The invention will now be explained in more detail with reference to the accompanying figures.

DETAILED DESCRIPTION

Figure 1:
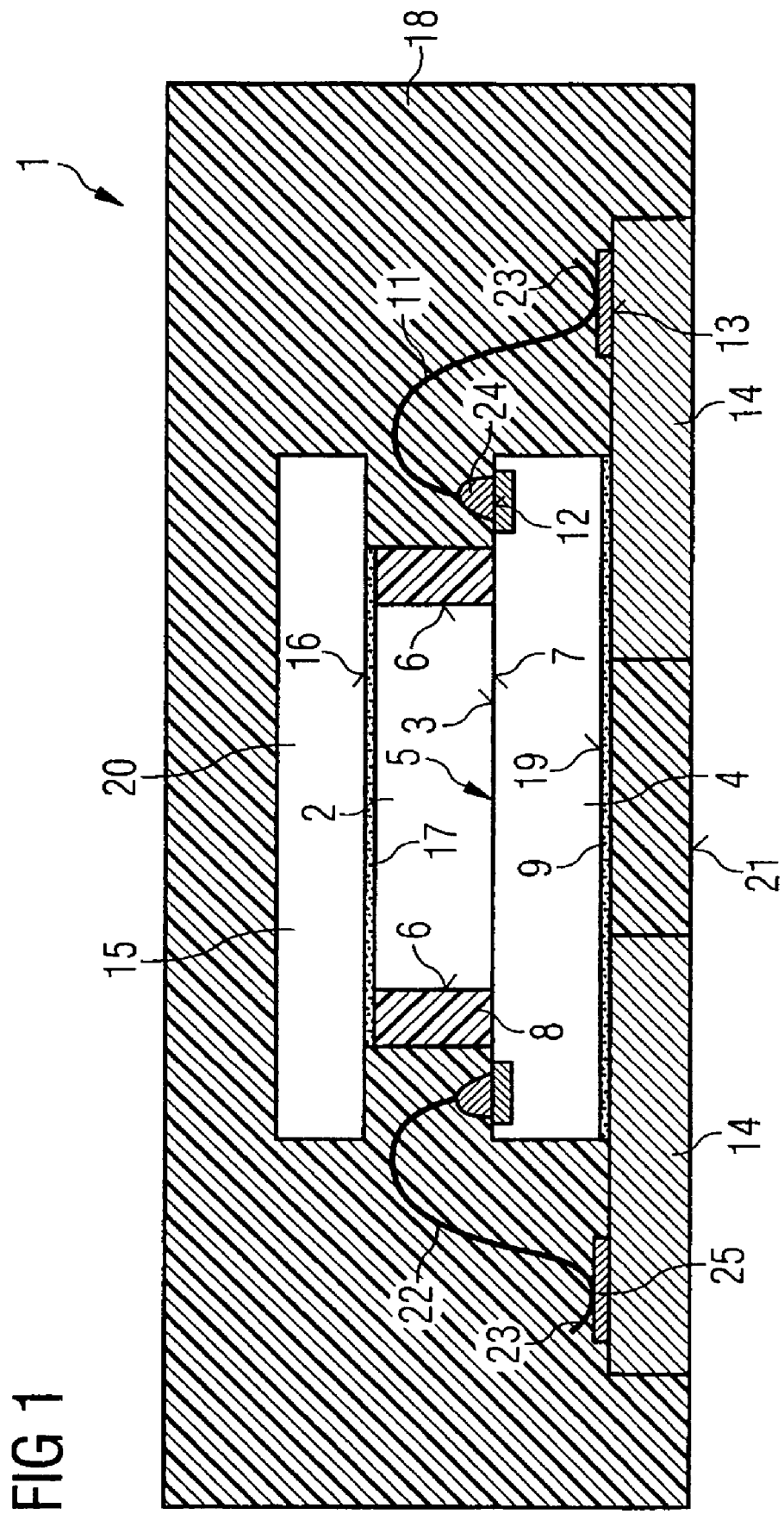
FIG. 1 shows a diagrammatic cross section through an electronic device of a first embodiment of the invention.

FIG. 1 shows a diagrammatic cross section through an electronic device 1 of a first embodiment of the invention. The entire device can be embedded in a plastics housing composition 18, which can have metallic external contacts 14 on the underside 21 of the electronic device 1. Via these metallic external contacts 14, there can be access to the circuit structure 5 of the first semiconductor chip 4. The circuit structure 5 can be a bulk acoustic wave filter above which a cavity 2 is arranged. The cavity 2 can be arranged directly above the circuit structure 5 on the top side 7 of the semiconductor chip and can leave the surface region 3 of the circuit structure 5 free of a plastic layer 6. This plastic layer 6 can form a cavity frame surrounding the circuit structure 5. This cavity frame can be closed off towards the top by a further semiconductor chip 15, which can be fixed on the cavity frame 8 by an adhesive film 17. This adhesive film 17 can seal the cavity 2 with respect to the plastics housing composition 18 so that no plastics housing composition 18 can penetrate into the cavity 2 during the molding of the electronic device 1. Moreover, the film 17 can compensate for unevennesses of the cavity frame 8. The semiconductor material of the lower semiconductor chip 4 with the circuit structure 5 and of the upper covering semiconductor chip 15 can be silicon.

In this embodiment of the invention, outside the cavity frame 8, contact areas 12 can be arranged on the top side 7 of the semiconductor chip 4. The contact areas 12 can be connected via thermocompression heads 24 and bonding wires 22 to a bondable coating 25 on inner areas 13 of the external contacts 14. The entire bonding connection 11 can be embedded in the plastics housing composition 18. The lower semiconductor chip 4 of the circuit structure 5 can be fixed by its rear side 19 on the inner areas of the external contacts 14 by a first adhesive film 9. The bonding connection 11 can be produced before the second semiconductor chip 15, with its adhesive film 17, can be deposited onto the cavity frame 8.

Both the first adhesive film 9 of the lower semiconductor chip 4 and the second adhesive film 17 of the covering semiconductor chip 15 can be precured with the aid of UV radiation for fixing purposes during the sawing out of the semiconductor chips from a wafer. After sawing-out into individual chips, as are shown in FIG. 1, the adhesive films 9 and 17 can be cured at 180° C. for 30 minutes. The base material of these adhesive films 9 and 17 is formed by a polyolefin having a thickness of 120 μm. The shear stress can be greater than 50 N/2 mm$^2$ at 25° C. and even at 250° C. a shear strength of almost 8 N/2 cm$^2$ results. These films can be furthermore distinguished by their small proportion of chlorine ions of less than 8.5 ppm and sodium ions of less than 0.5 ppm. The total thickness of the adhesive films can be, for example, 150 µm in this embodiment of the invention.

Figure 2:
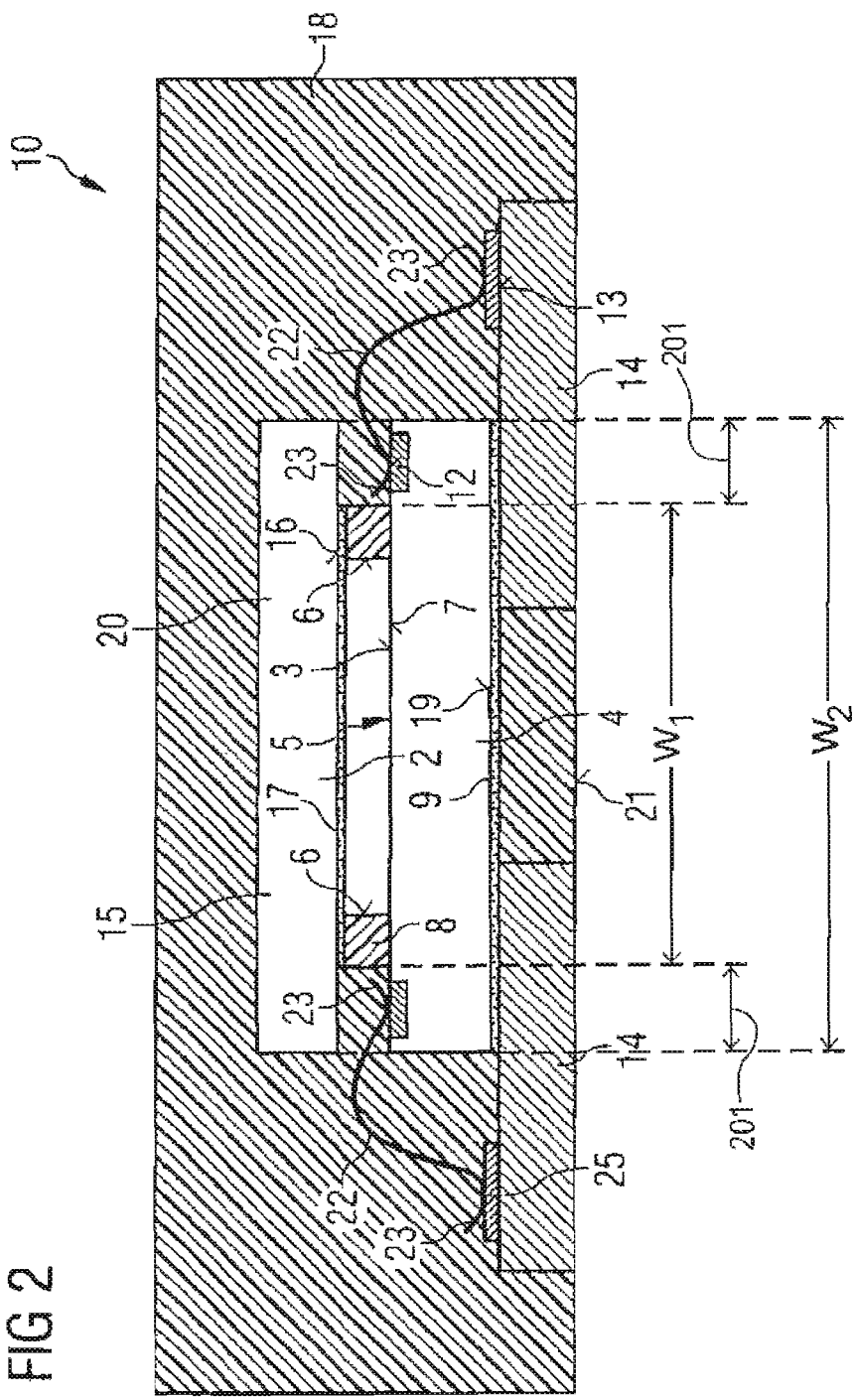
FIG. 2 shows a diagrammatic cross section through an electronic device of a second embodiment of the invention.

FIG. 2 shows a diagrammatic cross section through an electronic device 10 of a second embodiment of the invention. Components having functions identical to those in FIG. 1 are identified by the same reference symbols and are not discussed separately. The difference between the embodiment according to FIG. 1 is that the cavity 2 can be designed to be flatter than in the embodiment shown in FIG. 1. This flatter design can be made possible by dispensing with thermocompression heads for the connection of the contact areas 12 on the top side of the semiconductor chip 4 and in return forming a thermocompression arc 23 both on the semiconductor chip 4 and on the bondable area 25. This measure of choosing a bonding arc 23 for both bonding connections can enable the electronic device to be further miniaturized.

Figure 3:
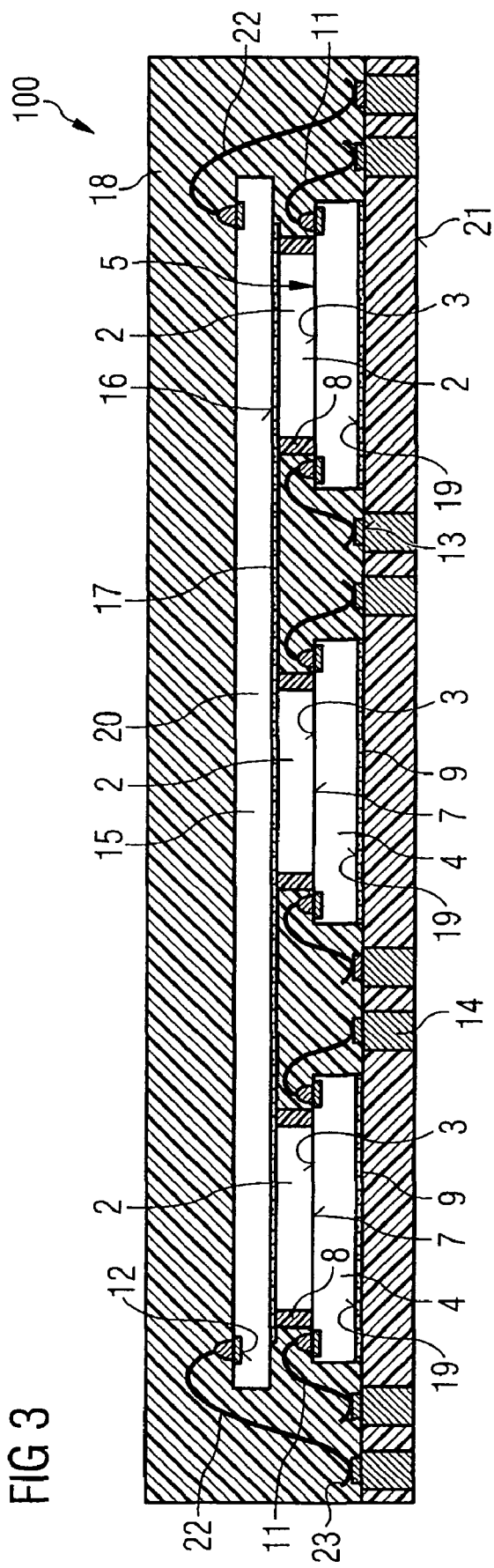
FIG. 3 shows a diagrammatic cross section through an electronic device of a third embodiment of the invention.
Figure 1:
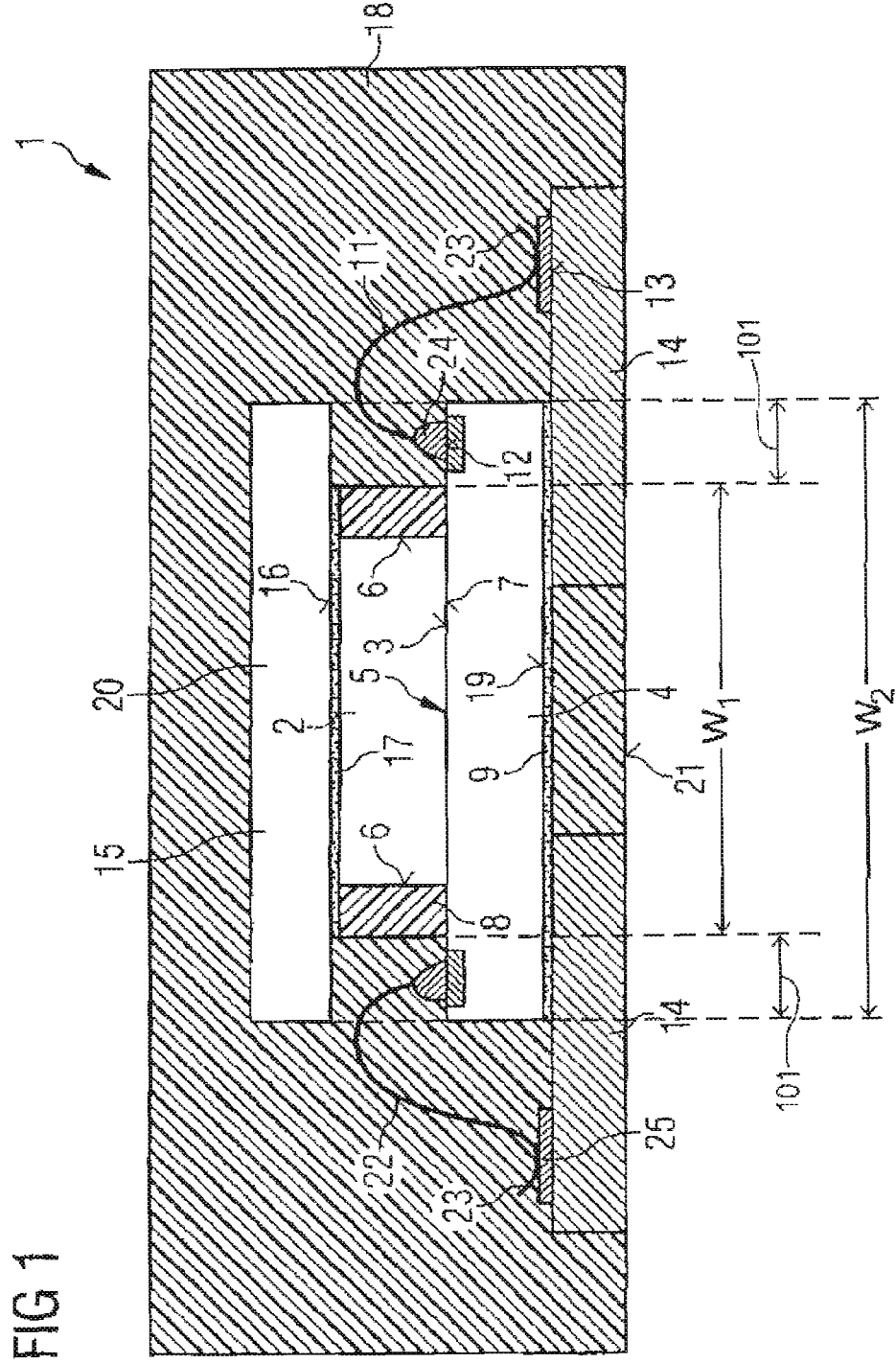

FIG. 3 shows a diagrammatic cross section through an electronic device 100 of a third embodiment of the invention. Here, too, components having functions identical to those in the preceding figures are identified by the same reference symbols. The electronic device is a circuit module in which three semiconductor chips 4 have circuit structures 5 provided with cavities 2 on their top sides 7. For this purpose, a cavity frame 8 can be arranged on each of the semiconductor chips by a photopatternable plastic layer 6. Extending over the cavities can be a common cavity cover 20 made of a single semiconductor chip 15, which can be provided with an adhesive film 17 made of polyolefin on its rear side 16. The adhesive film can seal the cavities 2 with respect to the plastics housing composition 18 and can compensate for unevennesses of the cavity frames 8. In this module, too, the external contacts 14 can lie on the underside 21 of the electronic device 100.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS 1, 10, 100 Electronic device
2 Cavity
3 Surface region
4 Semiconductor chip
5 Circuit structure
6 Patterned plastic layer
7 Top side of the semiconductor chip
8 Cavity frame
9 First adhesive film
11 Bonding connection
12 Contact areas on the top side of the semiconductor chip
13 Inner areas
14 External contacts
15 Covering semiconductor chip
16 Rear side of the covering semiconductor chip
17 Second adhesive film
18 Housing plastics composition
19 Rear side of the first semiconductor chip
20 Cavity cover
21 Underside of the electronic device
22 Bonding wire
23 Bonding arc
24 Thermocompression head
25 Bondable coatings

We claim:

1. An electronic device, comprising:
a semiconductor chip including a top side with a plurality of circuit structures that form a bottom region of a cavity, wherein the circuit structures on the semiconductor chip comprise bulk acoustic wave filters and/or surface acoustic wave filters;
a cavity frame disposed on the top side of the semiconductor chip;
contact areas disposed on the top side of the semiconductor chip external to the cavity frame, the contact areas being connected via bonding connections to inner areas of external contacts, wherein the bonding connections of the contact areas and the inner areas of external contacts each include a bonding arc; and
a cavity cover comprising a semiconductor material and being arranged on the cavity frame such that the cavity frame and cavity cover seal the cavity from penetration of a plastic housing composition during molding of the electronic device.

2. The electronic device according to claim 1, wherein the semiconductor chip and the cavity cover each include a UV curable adhesion layer of an adhesive film on respective rear sides.

3. The electronic device according to claim 1, wherein external contacts are arranged on an underside of the electronic device.

4. The electronic device according to claim 2, wherein the adhesive films have a thickness of between 100 and 150 micrometers.

5. The electronic device according to claim 1, wherein the semiconductor chip is disposed outside the cavity.

6. An electronic device, comprising:
a semiconductor chip module comprising a plurality of semiconductor chips embedded in a plastic housing composition, wherein the semiconductor chips include respective top sides with a plurality of circuit structures that form bottom regions of a respective plurality of cavities;
cavity frames respectively disposed on the top sides of the semiconductor chips; and
a common cavity cover comprising a semiconductor material and being arranged on the cavity frames such that the cavity frames and the common cavity cover seal the respective plurality of cavities from penetration of the plastic housing composition during molding of the electronic device.

* * * * *

US007268436C1

(12) INTER PARTES REEXAMINATION CERTIFICATE (705th)
United States Patent
Aigner et al.

(10) Number: US 7,268,436 C1
(45) Certificate Issued: Oct. 17, 2013

(54) ELECTRONIC DEVICE WITH CAVITY AND A METHOD FOR PRODUCING THE SAME

(75) Inventors: Robert Aigner, Unterhaching (DE); Albert Auburger, Regenstauf (DE); Frank Daeche, München (DE); Guenter Ehrler, Holzkirchen (DE); Andreas Meckes, München (DE); Horst Theuss, Wenzenbach (DE); Michael Weber, Mainburg (DE)

(73) Assignee: Avago Technologies Wireless IP (Singapore) Pte. Ltd., Singapore (SG)

Reexamination Request:
No. 95/001,303, Jan. 22, 2010

Reexamination Certificate for:
Patent No.: 7,268,436
Issued: Sep. 11, 2007
Appl. No.: 10/795,344
Filed: Mar. 9, 2004

(30) Foreign Application Priority Data

Mar. 10, 2003 (DE) .................. 103 10 617

(51) Int. Cl.
*H01L 23/12* (2006.01)
*H01L 23/31* (2006.01)
*H01L 23/48* (2006.01)
*H01L 23/495* (2006.01)
*H01L 23/52* (2006.01)
*H01L 29/40* (2006.01)
*H03H 9/05* (2006.01)

(52) U.S. Cl.
USPC .......... 257/777; 257/680; 257/686; 257/704; 257/E23.039; 257/E23.124

(58) Field of Classification Search
None
See application file for complete search history.

(56) References Cited

To view the complete listing of prior art documents cited during the proceeding for Reexamination Control Number 95/001,303, please refer to the USPTO's public Patent Application Information Retrieval (PAIR) system under the Display References tab.

*Primary Examiner* — Erik Kielin

(57) ABSTRACT

An electronic device can include a top side with circuit structures. The circuit structures form the bottom region of a cavity. Each cavity can be surrounded by a cavity frame made of plastic and can have a cavity cover made of semiconductor material.

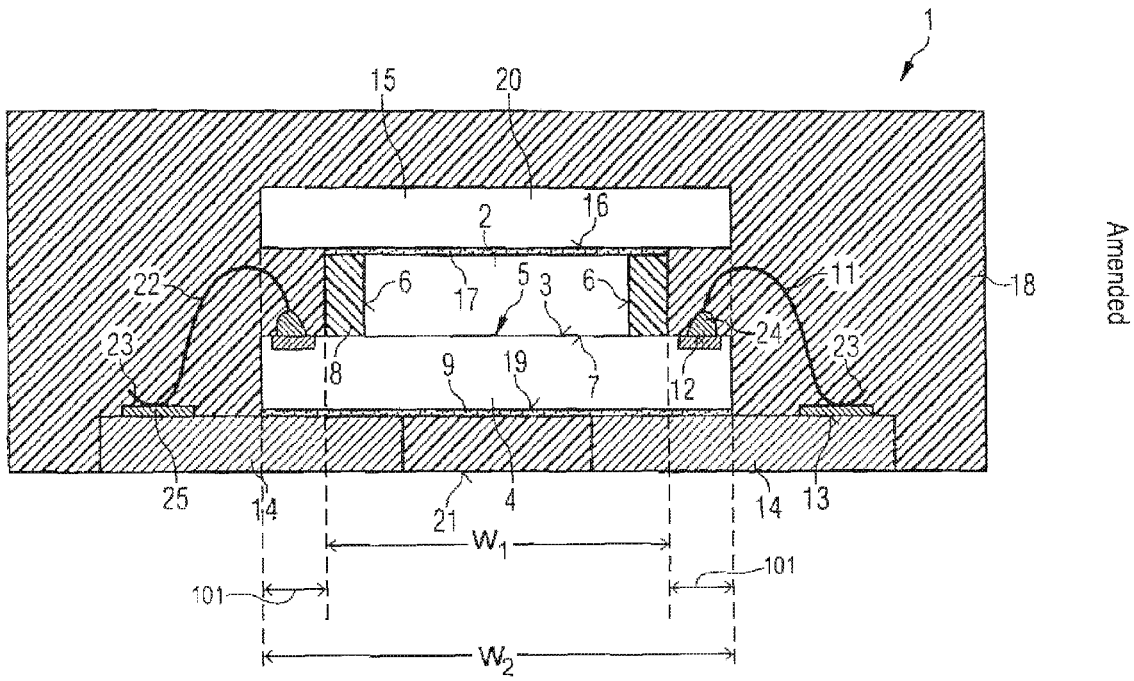

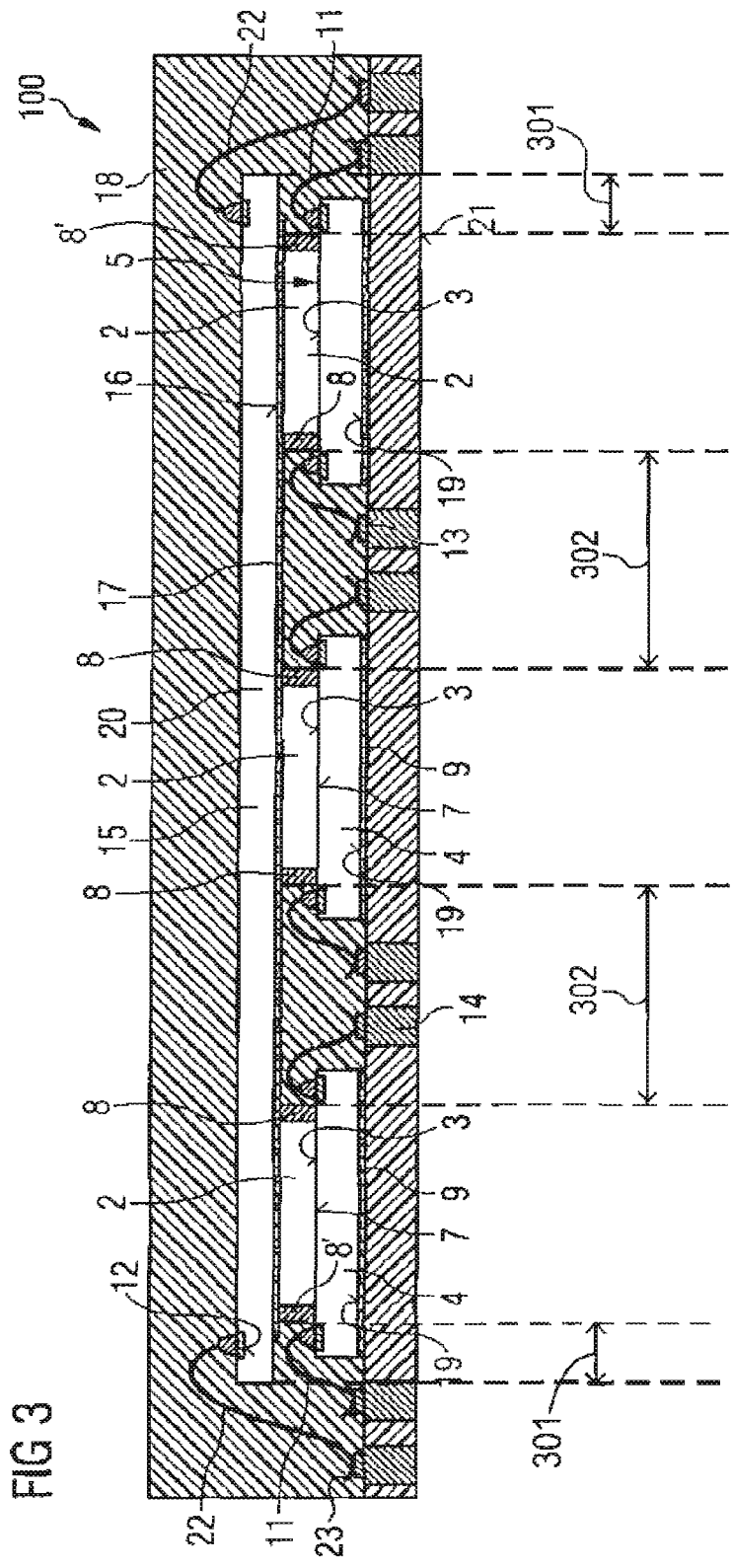

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 3, line 21:

Afterwards, the cavity frame can be covered with the second semiconductor chip. For this purpose, the second semiconductor chip can have an adhesive film on its rear side, which adhesive film corresponds to the adhesive film of the first semiconductor chip. This adhesive film on the rear side of the second semiconductor chip can provide for compensation of unevennesses of the cavity frame around each circuit structure. *The cavity frame has a first width and the cavity cover has a second width. The second width is greater than the first width. As such, the cavity cover "overhangs" the cavity frame.* After the fitting of the second semiconductor chip as cavity cover, the semiconductor chips can be packaged with the bonding wires in a plastics housing composition. In this case, the bonding wires, the semiconductor chips, and the cavity frame can be embedded in the plastics composition, and the external contacts at the underside of the electronic device can remain freely accessible.

Column 4, lines 43-44:

*The cavity frame 8 has a first width (shown as $w_1$ in FIG. 1) and the cavity cover 20 has a second width (shown as $w_2$ in FIG. 1). The second width ($w_2$) is greater than the first width ($w_1$). As such the cavity cover 20 "overhangs " the cavity frame 8 b an overhang 101 on either side of the cavity frame 8.*

Column 5, lines 20-21:

*The cavity frame 8 has a first width (shown as $w_1$ in FIG. 2) and the cavity cover 20 has a second width (shown as $w_2$ in FIG. 2). The second width ($w_2$) is greater than the first width ($w_1$). As such, the cavity cover 20 "overhangs" the cavity frame 8 by an overhang 201 on either side of the cavity frame 8.*

Column 5, lines 37-38:

*As shown in FIG. 3 the common cavity cover 20 overhangs an outermost cavity frames 8' by an overhang 301. The overhang 301 between the common cavity cover 20 and outermost cavity frames 8' is on both ends of the common cavity frame 20. The common cavity frame 20 also overhangs cavity frames 8 (i.e., interior cavity frames) by overhangs 302 as shown in FIG. 3.*

THE DRAWINGS FIGURE HAVE BEEN CHANGED AS FOLLOWS:

FIGS. 1, 2, and 3 are amended to include the vertical dotted lines to show the difference between the cavity cover and the cavity frame.

AS A RESULT OF REEXAMINATION, IT HAS BEEN DETERMINED THAT:

Claims 1-6 are cancelled.

\* \* \* \* \*